United States Patent [19]

McClure

[11] Patent Number: 5,487,048
[45] Date of Patent: Jan. 23, 1996

[54] MULTIPLEXING SENSE AMPLIFIER

[75] Inventor: David C. McClure, Carrollton, Tex.

[73] Assignee: SGS-Thomson Microelectronics, Inc., Carrollton, Tex.

[21] Appl. No.: 41,321

[22] Filed: Mar. 31, 1993

[51] Int. Cl.[6] .................................................. G11C 7/06
[52] U.S. Cl. .................. 365/207; 365/205; 365/189.02; 365/230.03
[58] Field of Search .............................. 365/189.02, 205, 365/230.03, 156, 207, 208; 307/530, 355

[56] References Cited

U.S. PATENT DOCUMENTS

| | | | |
|---|---|---|---|
| 4,133,049 | 1/1979 | Shirato | 365/207 |
| 4,509,147 | 4/1985 | Tanimura et al. | 365/207 |
| 4,584,672 | 4/1986 | Schutz et al. | 365/205 |
| 4,634,900 | 1/1987 | Koshizuka | 307/530 |
| 4,754,433 | 6/1988 | Chin et al. | 365/189.02 |
| 4,811,297 | 3/1989 | Ogawa | 365/189.02 |
| 4,907,201 | 3/1990 | Minami et al. | 365/207 |
| 4,984,206 | 1/1991 | Komasu et al. | 307/530 |
| 5,233,558 | 8/1993 | Fujii et al. | 365/207 |
| 5,241,503 | 8/1993 | Cheng | 365/205 |
| 5,241,504 | 8/1993 | Seevinck | 365/205 |

Primary Examiner—David C. Nelms
Assistant Examiner—Vu A. Le
Attorney, Agent, or Firm—Kenneth C. Hill; Lisa K. Jorgenson; Richard K. Robinson

[57] ABSTRACT

A memory system including a memory array having at least two pairs of data lines, first and second data lines, that correspond to columns in the memory array. A first stage is included having inputs connected to the two pairs of data lines. The first stage also has a pair of output lines, a true output lines and a complement output line, wherein output signals generated in the output lines are controlled by a first and second set of transistors. Each transistor in the first set has a gate connected to one of the input lines, and each transistor in the second set is connected in series with one of the transistors in the first set and may be selectively turned on and turned off, wherein of one of the two pairs of data lines may be selected by turning transistors on and off in the second set.

13 Claims, 3 Drawing Sheets

MULTIPLEXING SENSE AMPLIFIER

CROSS-REFERENCE TO RELATED APPLICATION

The present application is related to U.S. patent application Ser. No. 08/040,916, entitled "Multiplexing Sense Amplifier" filed of even date herewith by the inventor hereof, assigned to the assignee herein, and incorporated herein by reference.

BACKGROUND OF THE INVENTION

1. Field of the Invention

The present invention relates generally to the field of microelectronics and in particular to a method and apparatus for sensing signals from a memory array. Still more particularly, the present invention relates to a method and apparatus for selecting and sensing signals from a memory array.

2. Description of the Prior Art

Memories are devices that respond to operational orders, usually from a central processing unit (CPU) of a digital computer. A sense amplifier is typically employed to detect attenuated signals from a memory array. Two types of sense amplifiers are typically used: a static sense amplifier and a dynamic sense amplifier. Dynamic sense amplifiers are often used because they have low current consumption and the sense amplifiers are activated only when required to perform sensing functions.

Referring to FIG. 1, a memory array 100, a multiplexer 102, and a sense amplifier 104 are depicted in a configuration known to those skilled in the art. Memory array 100 contains a number of bit line pairs that may be accessed using word, lines (not shown). Frequently in memory arrays, such as memory array 100, sense amplifier 104 is shared among many columns of the memory array. In addition, the data fed into sense amplifier 104 might be multiplexed between different blocks of columns within memory array 100. In the depicted example, left block 100a and right block 100b of memory array 100 share sense amplifier 104. Two pairs of data lines, LBT, LBC, RBT, and RBC originate from memory array 100 and are connected to multiplexer 102. Data lines LBT and LBC originate from left block 100a of memory in memory array 100; data lines RBT and RBC originate from right block 100b in memory array 100. Data lines LBT and LBC carry left block true and complement data signals respectively, while data lines RBT and RBC carry right block true and complement data signals respectively. Multiplexer 102 is used to select data from one pair of data lines and is connected to sense amplifier 104. Sense amplifier 104 may include a number of different stages.

Referring next to FIG. 2, sense amplifier 104 may include the following stages: level shifter 106, current mirror 108, and p-channel cross-coupled amplifier 110. A level shifter is typically employed to shift the voltage of the multiplexed signals in order to optimize the other stages of the sense amplifier. Typically, level shifter 106 is used to adjust the voltage of the signal selected by multiplexer 102 in order to optimize the performance of the other stages within sense amplifier 104. Sense amplifier 104 is employed to detect signals, in lines MUXC and MUXT, selected by multiplexer 102 from memory array 100. Typically, sense amplifier 104 includes p-channel cross-coupled amplifier 110 with a high common-mode rejection in order to reject picked-up interference due to cross-talk from other parts of the system.

With reference now to FIG. 3, a schematic diagram of a known multiplexer is illustrated. The multiplexer is constructed with transistors MA-MM. The transistors are p-channel metal-oxide semiconductor field effect transistors (MOSFETs). Multiplexer 102 is powered by connecting transistors ME, MG, MH, MI, MJ, and ML to power supply VCC. Points 111, 113, and 115 are points at which an equalization signal is applied to multiplexer 102.

Data from data line LBT is fed into the multiplexer 102 at input point 112; data from the data line LBC is fed into multiplexer 102 at input point 114; data from data line RBT is fed into multiplexer 102 at input point 116; and data from data line RBC is fed into multiplexer 102 at input point 118.

The selection between the right block signals and the left block signals are made utilizing transistors MA, MB, MC, and MD. These transistors are p-channel MOSFETs. A low select signal into input point 120, connected to the gates of transistors MA and MB, turns on transistors MA and MB causing the selection of signals from data lines LBT and LBC to be selected and sent out at output points 122 and 124, as true complement signals in data lines MUXT and MUXC respectively. A low select signal into input point 126, which is connected to the gates of transistors MC and MD, causes the true signal in data line RBT to be sent to sense amplifier 104 via output 122 connected to line MUXT and the complement signal from data line RBC to be sent to sense amplifier 104 via output point 124 connected to line MUXC. The use of multiplexer 102 typically causes a signal drop. It is desirable to have as much signal as possible for speed and reliability.

More information on semiconductor memories and sense amplifiers may be found in the following references: Prince, Semiconductor Memories, John Wiley and Sons (2nd Ed. 1991) and Haznedar, Digital Microelectronics, The Benjamin/Cummings Publishing Company, Inc. (1991).

Therefore, it would be desirable to have a method and apparatus for multiplexing and sensing a data signal from a memory array without diminishing the data signal being sensed.

SUMMARY OF THE INVENTION

The present invention provides a memory system that includes a memory array having at least two pairs of data lines, first and second data lines, that correspond to columns in the memory array. A selection stage is included having inputs connected to the two pairs of data lines. The selection stage also has a pair of output lines, a true output lines and a complement output line, wherein output signals generated in the output lines are controlled by a first and second set of transistors. Each transistor in the first set has a gate connected to one of the input lines, and each transistor in the second set is connected in series with one of the transistors in the first set and may be selectively turned on and turned off, wherein of one of the two pairs of data lines may be selected by turning transistors on and off in the second set.

The present invention also provides a multiplexing sense amplifier circuit for use with a memory array. The multiplexing sense amplifier includes a selection stage having inputs connected to first and second data lines. This selection stage also has a pair of output lines, a true output lines and a complement output line, wherein output signals generated in the output lines are controlled by a first and second set of transistors. Each transistor in the first set has a gate connected to one of the input lines, and each transistor in the second set is connected in series with one of the transistors in the first set and may be selectively turned on and turned off, wherein of one of the two data lines may be selected by turning transistors on and off in the second set.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
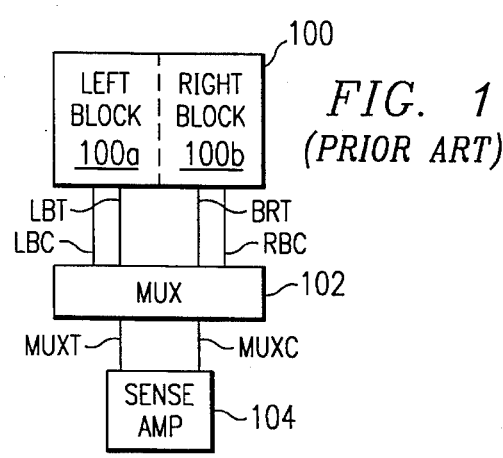
FIG. 1 is a block diagram of a portion of a memory system illustrating a configuration of a memory array, a multiplexer, and a sense amplifier known in the prior art.
Figure 2:
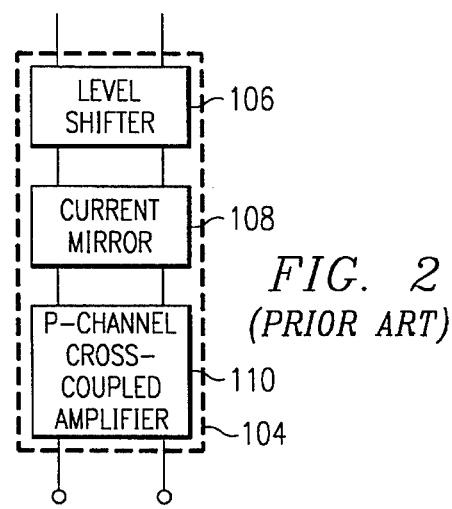
FIG. 2 is a block diagram of a sense amplifier known in the prior art.
Figure 3:
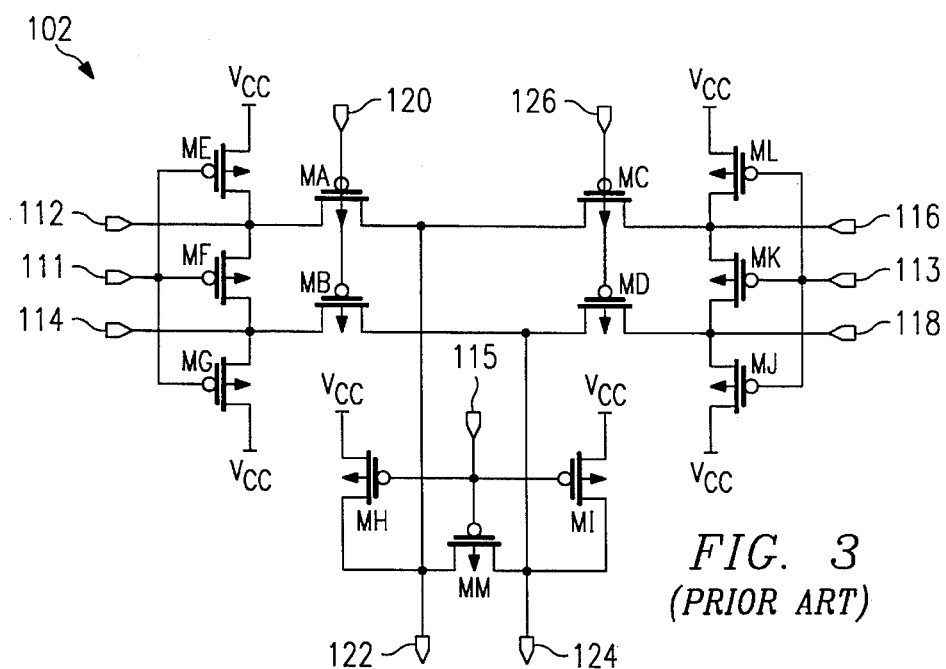
FIG. 3 is a schematic diagram of a multiplexer known in the prior art.

In accordance with a preferred embodiment of the present invention, the multiplexing function is incorporated into the sense amplifier in order to reduce the effects of having a separate multiplexer selecting signals as illustrated in the prior art design in FIG. 1.

Figure 4:
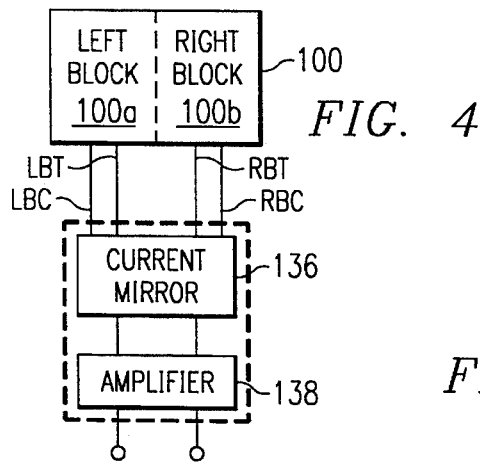
FIG. 4 is a block diagram of a portion of a memory system configured according to the present invention.

Referring now to FIG. 4, a block diagram of a portion of a memory system configured according to the present invention is illustrated. Memory array 100 again includes left block 100a and right block 100b. Signals from data lines LBT, LBC, RBC, and RBT are fed directly into sense amplifier 130, instead of a multiplexer. Signals from data lines LBT and RBT are true signals, while signals from data lines LBC and RBC are complement signals. In accordance with a preferred embodiment of the present invention, sense amplifier 130 includes a current mirror stage 136 and an amplifier stage 138. Multiplexing or selection functions are incorporated into current mirror stage 136 in accordance with a preferred embodiment of the present invention.

Figure 5:
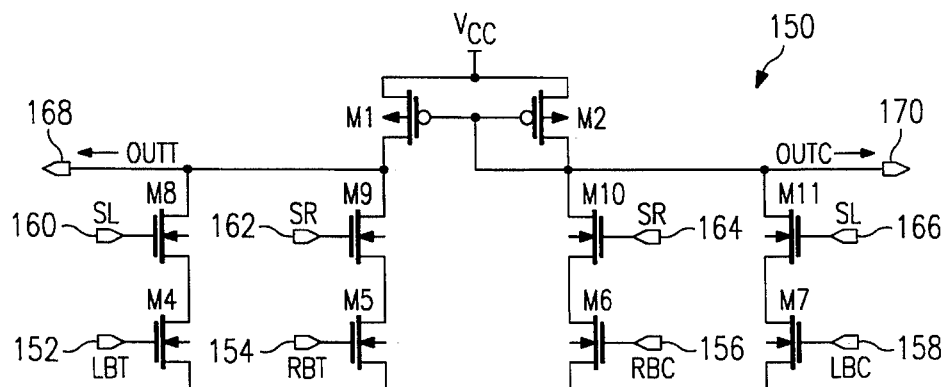
FIG. 5 is a schematic diagram of a current mirror according to the present invention.

Next, FIG. 5 illustrates a schematic diagram of a current mirror in accordance with a preferred embodiment of the present invention. Current mirror 150 is comprised of transistors M1–M11 and forms a portion of the selection stage of the sense amplifier. These transistors are n-channel and p-channel MOSFETs. The circuit is powered by connecting the drains of transistors M1 and M2 to power supply VCC, while connecting the source of transistor M3 to power supply VSS. Power supply VCC is typically at a higher voltage relative to power supply VSS. This circuit is enabled and disabled via signal applied to the gate of transistor M3 through input point 172. The circuit is disabled when transistor M3 is turned off.

In this circuit, data line LBT is connected to transistor M4 at input point 152 in FIG. 4; data line RBT is connected to the gate of transistor M5 at input point 154 in FIG. 4; data line RBC is connected to the gate of transistor M6 at input point 156 in FIG. 4; and data line LBC is connected to the gate of transistor M7 at input point 158. Transistors M4–M7 control the flow of current mirror 150. The current flow varies in response to signals applied to the gates of these transistors from the data lines.

A pair of data lines, LBT and LBC or RBT and RBC, may be selected in this circuit, depicted in FIG. 4, using transistors M8–M11, which are in a series configuration with transistors M4–M7. The series connections are as follows: transistor M8 is in series with transistor M4; transistor M9 is in series with transistor M5; transistor M10 is in series with transistor M6; and transistor M11 is in series with transistor M7. Selection signals at input points 160, 162, 164, and 166 control the output at output points 168 and 170. If the left block signals LBT and LBC are to be selected, a high signal is applied to the gates of transistors M8 and M11, via input points 160 and 166. A low signal is applied to the gates of transistors M9 and M10, via input points 162 and 164. As a result, current flows through transistors M4, M7, M8, and M11 since transistors M8 and M11 allow current to flow. The low signal applied to the gates of transistors M9 and M10 prevents current flow through that portion of the circuit. A "high signal" is a signal that completely turns on a transistor, while a "low signal" is a signal that completely turns off a transistor.

Similarly, if a selection of data lines RBT and RBC are desired, a high signal is applied to the gates of transistors M9 and M10, via input points 162 and 164 while a low signal is applied to the gates of transistors M8 and M11 via input points 160 and 166.

Figure 4A:
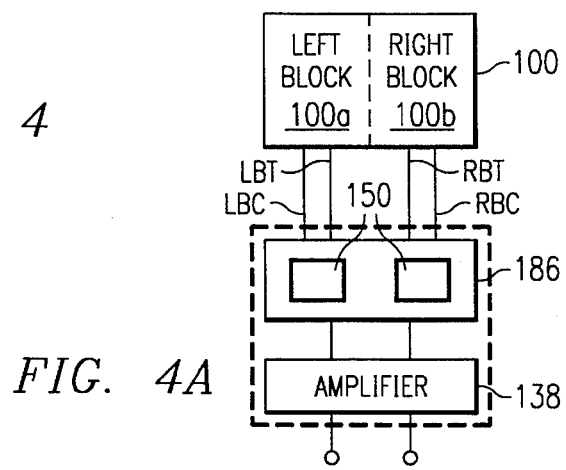
FIG. 4A is a block diagram of a portion of a memory system including two current mirrors in the current mirror stage.

In accordance with a preferred embodiment of the present invention, two current mirror circuits, such as current mirror 150 are utilized in current mirror stage 136 as depicted in FIG. 4A. The first current mirror circuit supplies signal OUTT through output point 168, while the other current mirror circuit supplies signal OUTC through its output point 168, and has its inputs reversed from those shown in FIG. 5.

Figure 6:
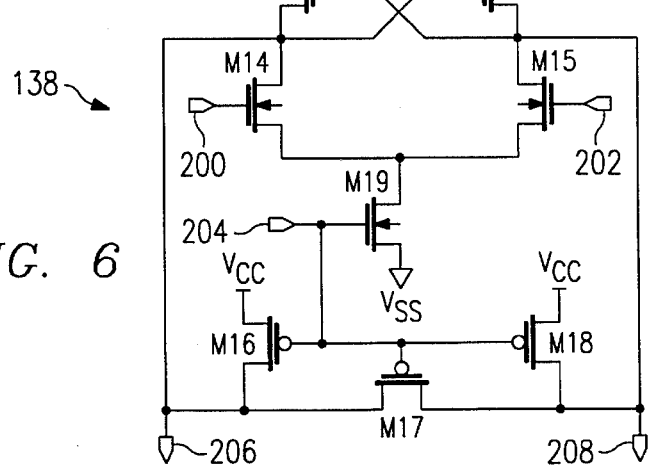
FIG. 6 is a schematic diagram of a p-channel cross-coupled amplifier according to the present invention.

Referring now to FIG. 6, a schematic diagram of a amplifier stage 138 within a sense amplifier is depicted according to the present invention. Amplifier stage 138 is constructed from transistors M12–M19. This circuit is powered by connecting the sources of transistors M12 and M13 to power supply VCC and connecting the source transistor M19 to power supply VSS. This amplifier stage is a p-channel cross-coupled amplifier and functions as a flip-flop in accordance with a preferred embodiment of the present invention. Transistors M12 and M13 are p-channel transistors, while transistor M14–M19 are n-channel transistors.

Output point 168 in FIG. 5 is connected to input point 200, and output point 170 in FIG. 5 is connected to input point 202. Transistors M14 and M15 control the output of amplifier circuit 198. The output is determined by the OUTT and OUTC from signals from the mirror circuits as applied to the gates of transistors M14 and M15, respectively. Transistors M12–M15 form a flip-flop in this circuit. Transistor M17 provides balancing within the circuit, and transistors M16 and M18 are used to pre-charge the circuit. The circuit is enabled and disabled by applying a control signal to input point 204 to the gates of transistors M16, M17, M18, and M19. The circuit is disabled when M19 is turned off.

Output points 206 and 208 provide logic outputs in response to signals OUTT and OUTC being applied to the gates of transistors M14 and M15 via input points 200 and 202. Signals OUTT and OUTC from the current mirror stage are processed in this circuit to produce a logic "1" or logic "0" output at output points 206 and 208.

Figure 7:
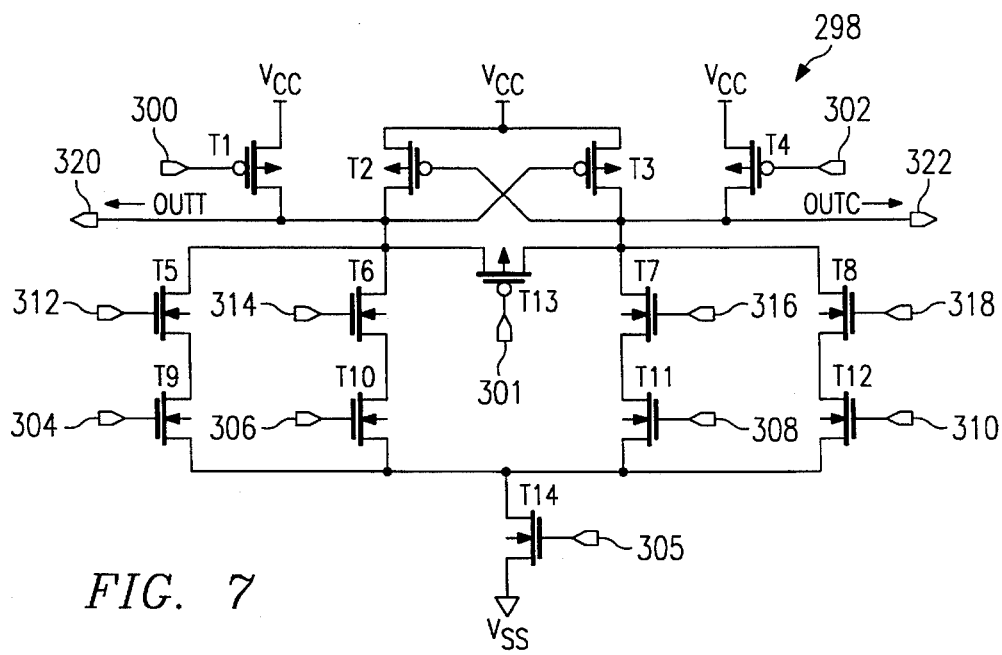
FIG. 7 is a schematic diagram of a p-channel cross-coupled amplifier according to the present invention.

Current mirror stage 136 in FIG. 4 may be replaced by a number of different stages in accordance with other preferred embodiments of the present invention. For example, a p-channel cross-coupled amplifier 298, as depicted in FIG. 7, may be used in place of the two current mirrors in current mirror stage 136 in FIG. 4. P-channel cross-coupled amplifier 298 is constructed from transistors T1–T14 and T13. Transistors T1–T4 are p-channel MOSFETs. The remaining transistors, T5–T14 and T12, are n-channel MOSFETs. P-channel cross-coupled amplifier 298 is powered by connecting transistors T1–T4 to power supply VCC and connecting the source of transistor T14 to power supply VSS. P-channel cross-coupled amplifier 298 is enabled when a select signal is high at input points 300, 301, and 302, and 305, which are connected to the gates of transistors T1, T13, T4, and T14.

In this circuit, inpsut point 304 is connected to data line LBT, input point 306 is connected to data line RBT, input point 308 is connected to data line RBC, and input point 310 is connected to data line LBC. Signals from these data lines control the gates of transistors T9–T12 which results in a varying amount of current flowing through the transistors in response to varying signals from the data lines. These transistors are connected in a series configuration with transistor T5–T8 as follows: transistor T5 is connected in series with transistor T9; transistor T6 is connected in series with transistor T10; transistor T7 is connected in series with transistor T11; and transistor T8 is connected in series with transistor T12.

Transistors T5–T8 work in conjunction with transistors T9–T12 to provide a output resulting from a selection of two data lines from the memory array. Select signals are applied to input points 312, 314, 316 and 318 to select signals from the left block of data lines, LBT and LBC, or the right block of data lines, RBT and RBC. The resulting output signal OUTT is applied to the gate of transistor M14 in the amplifier in FIG. 6 by connecting output point 320 to input point 200, while the resulting output signal OUTC is applied to the gate of transistor M15 in FIG. 6 by connecting output point 322 to input point 202.

Right block signals, RBT and RBC are selected by applying a high signal to the gates of transistors T6 and T7 via input points 314 and 316, while applying a low signal to transistors T5 and T8 through input points 312 and 318.

Figure 8:
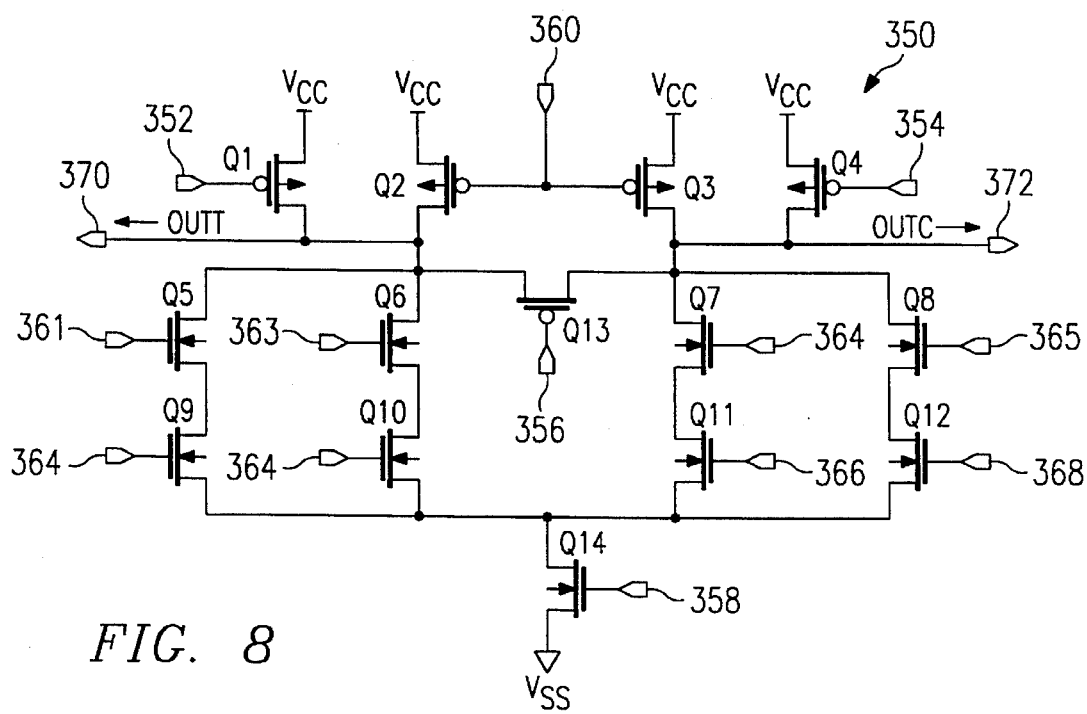
FIG. 8 is a schematic diagram of a differential amplifier according to the present invention.

Referring now to FIG. 8, a schematic diagram of a differential amplifier, which may be substituted in place of current mirror stage 136 in FIG. 4 is illustrated. Differential amplifier 350 is comprised of transistors Q1–Q14. Transistors Q1, Q2, Q3, Q4, and Q13 are p-channel MOSFETs, while the remaining transistors are n-channel MOSFETs. This circuit is powered by connected the sources of transistors Q1–Q4 to power supply VCC and connecting the source of transistor Q14 to power supply VSS.

Transistors Q1, Q4, Q14 and Q13 are used to enable and disable differential amplifier 350. These transistors are controlled by control signals at input points 352, 354, 356, and 358. A bias signal (or ground) is applied to the amplifier at input point 360, which controls the gates of transistors Q2 and Q3. The gate of transistor Q9 is connected to data line LBT at input point 364 and the gate of transistor Q10 is connected to data line RBT at input point 364. The gate of transistor Q11 is connected to data line RBC at input point 366 while the gate of transistor Q12 is connected to data line LBC at input point 368.

Transistors Q5–Q8 are used to select the data lines for amplification. These transistors are placed in series with transistors Q9–Q12 in the following manner: transistor Q5 is connected in series with transistor Q9; transistor Q6 is connected in series with transistor Q10; transistor Q7 is connected in series with Q11; and transistor Q8 is connected in series with transistor Q12. Select signals at input points 361, 363, 364, and 365 are used to control the transistors Q5–Q8 to select data lines for amplification.

For example, if the right block data lines, RBT and RBC, are desired, a high signal is applied to the gates of transistors Q6 and Q7 via input points 363 and 364. In addition, a low signal is applied to the gates of transistors Q5 and Q8 through input points 361 and 365. As a result of these signals, no current flows through transistors Q5, Q9, Q8 and Q12, while current flows through transistors Q6, Q10, Q7, and Q11. The current flow through transistors Q6, Q10, Q7, and Q11 is determined by the voltage to the gates of transistors Q10 and Q11. Signal OUTT controls the gate of transistor M14 in FIG. 6 through a connection between output point 370 and input point 200. Signal OUTC controls transistor M15 in FIG. 6 through a connection between output point 372 and input point 202.

Figure 9:
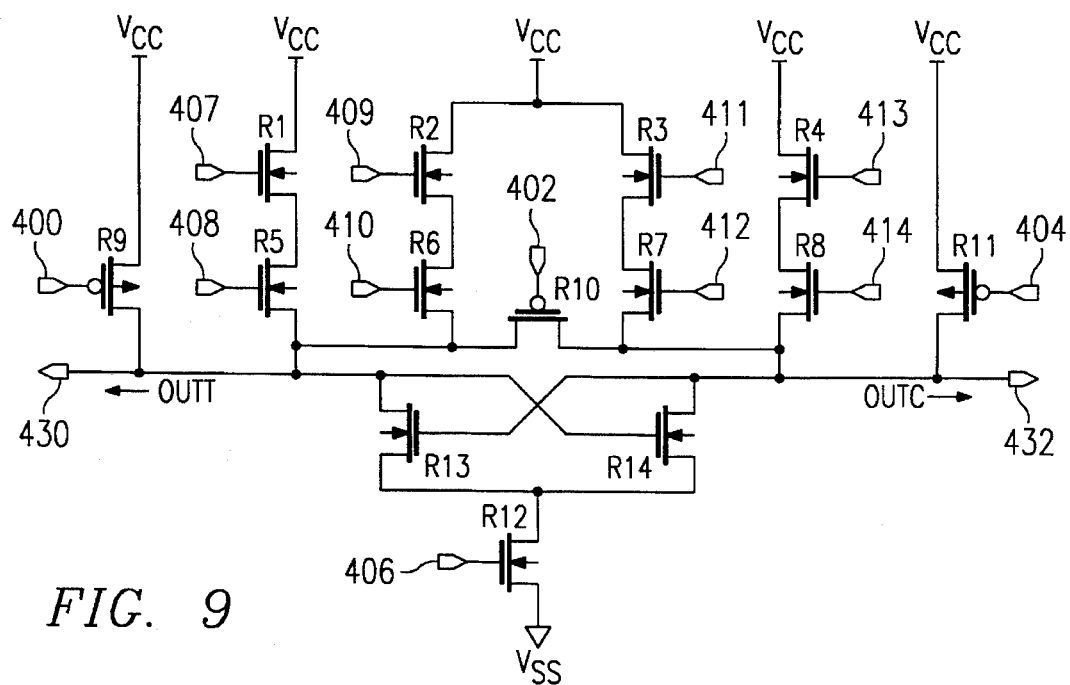
FIG. 9 is a schematic diagram of a level shifter according to the present invention.

Referring now to FIG. 9, transistors R1–R12 form a level shifter that may be used in place of the current mirrors in current mirror stage 136 in FIG. 4. Transistors R9, R10, and R11 are p-channel MOSFETs, while transistors R1–R8 and R12 are n-channel MOSFETs in accordance with a preferred embodiment of the present invention. Transistors R9–R12 are employed to enable and disable the circuit through signals at input points 400, 402, 404, and 406 connected to the gates of these transistors. The circuit is powered by connecting the drains of transistors R1–R4, R9, and R11 to power supply VCC while connecting the source of transistor R12 to power supply VSS.

The gate of transistor R1 is connected to data line LBT, and the gate of transistor R2 is connected to data line RBT. The gate of transistor R3 is connected to data line RBC, while the gate of transistor R4 is connected to data line LBC. These transistors, R1–R4, are connected in a series configuration with transistors R5–R8 as follows: R1 in series with R5, R2 in series with R6, R3 in series with R7, and R4 in series with R8. Transistors R5–R8 are used to select signals from selected data lines. These transistors, R5–R8, are controlled by signals applied to input points 408, 410, 412, and 414.

For example, if signals from the left block of data lines LBT and LBC are desired, a high signal would be applied to the gates of transistors R5 and R8, while a low signal would be applied to the gates of transistors R6 and R7. As a result, current would flow through transistors R1, R5, R4, and R8 and not through transistors R2, R6, R3 and R7. Signals from data lines RBT and RBC would be selected by applying a high signal to transistors R6 and R7 and a low signal to transistors R5 and R8. The output signal generated, OUTT controls the gate of transistor M14 in FIG. 6 by connecting output point 430 with input point 200. The output signal OUTC controls the gate of transistor M15 through a connection between output point 432 and input point 202 in FIG. 6.

Although the depicted embodiments, employ data line pairs, containing true and complement signals, those of ordinary skill in the art will realize that single data lines may be employed as inputs to the multiplexing sense amplifier, rather than pairs of true and complement lines. In addition, the depicted embodiment illustrates the use of an amplifier stage in addition to a selection stage such as a current mirror, p-channel cross-coupled amplifier, a differential amplifier, and a level shifter. In accordance with a preferred embodiment of the present invention, this amplifier stage may be eliminated depending on the design considerations. As a result, signals from the selection stage are provided as the outputs of the sense amplifier.

One advantage of the present invention is that it provides a faster and more sensitive sense amplifier because signal losses resulting from signals propogating through a transmission gate in a multiplexer stage are eliminated. Additionally, the present invention provides for smaller and simpler circuitry for selecting and sensing signals from data lines in multiple blocks of memory. The present invention is depicted using MOS technology. Other types of technology and transistors may be used in accordance with a preferred embodiment of the present invention.

What is claimed is:

1. A memory system comprising:

a memory array having at least first and second pairs of data lines corresponding to columns in the memory array; and a multiplexing sense amplifier including a selection stage having input lines connected to the first and second pairs of data lines, the selection stage also having a true output line and a complement output line, wherein output signals generated in the output lines are controlled by a first and second set of transistors, wherein each transistor in the first set has a gate connected to one of the input lines and each transistor in the second set is connected in series with one of the transistors in the first set and may be selectively turned on and turned off, wherein one of the two pairs of data lines may be selected by turning transistors on and off in the second set, wherein said multiplexing sense amplifier includes a common current source provided by a control transistor having a first source/drain connected to a power supply voltage and a second source/drain connected to the first and second sets of transistors by a common node, wherein the multiplexing sense amplifier may be enabled and disabled by turning the control transistor on and off, and wherein the selection stage further includes a p-channel cross-coupled amplifier.

2. The memory system of claim 1 further comprising an amplifying stage for generating logic output signals in response to the output signals from the selection stage.

3. The memory system of claim 2, wherein the amplifying stage comprises a flip-flop.

4. The memory system of claim 2, wherein the amplifying stage comprises a p-channel cross-coupled metal-oxide semiconductor field effect transistor amplifier.

5. The memory system of claim 1, wherein the selection stage further comprises two current mirrors.

6. The memory system of claim 1, wherein the selection stage further comprises a differential amplifier.

7. The memory system of claim 1, wherein the selection stage further comprises a level shifter circuit.

8. A multiplexing sense amplifier circuit comprising:

a selection stage having inputs connected to first and second data lines, the selection stage also having a true output line and a complement output line, wherein output signals sent to the output lines are controlled by a first and second set of transistors, each transistor in the first set has a gate connected to one of the input lines and each transistor in the second set is connected in series with one of the transistors in the first set and may be selectively turned on and turned off, wherein one of the two data lines may be selected by turning transistors on and off in the second set, wherein said multiplexing sense amplifier includes a common current source provided by a control transistor having a first source/drain connected to a power supply voltage and a second source/drain connected to the first and second sets of transistors by a common node, wherein the multiplexing sense amplifier may be enabled and disabled by turning the control transistor on and off, and further including a p-channel cross-coupled amplifier; and an amplifying stage for generating logic output signals in response to the output signals from the selection stage;

wherein each data line is a pair of data lines, and wherein selection of signals from the first data lines may be accomplished by turning on the transistors in the second set of transistors that are connected in series with transistors having gates connected to the first data lines and turning off the transistors in the second set of transistors that are connected in series with transistors having gates connected to the second data lines.

9. The multiplexing sense amplifier of claim 8, wherein the amplifying stage comprises a flip-flop.

10. The multiplexing sense amplifier of claim 8, wherein the selection stage further comprises two current mirrors.

11. The multiplexing sense amplifier of claim 8, wherein the selection stage further comprises a differential amplifier.

12. The multiplexing sense amplifier of claim 8, wherein the selection stage further comprises a level shifter circuit.

13. The multiplexing sense amplifier of claim 8, wherein the selection stage further comprises one current mirror.

* * * * *